United States Patent [19]

Lee

[11] Patent Number: 5,298,777

[45] Date of Patent: Mar. 29, 1994

[54] CCD IMAGE SENSOR OF INTERLACED SCANNING TYPE

[75] Inventor: Seo K. Lee, Kyungki, Rep. of Korea

[73] Assignee: Gold Star Electron Co., Ltd., Chungcheongbuk, Rep. of Korea

[21] Appl. No.: 97,539

[22] Filed: Jul. 27, 1993

Related U.S. Application Data

[63] Continuation of Ser. No. 834,113, Feb. 11, 1992, abandoned.

[30] Foreign Application Priority Data

Feb. 12, 1991 [KR] Rep. of Korea ............... 2373/1991

[51] Int. Cl.⁵ .................. H01L 29/78; H01L 27/14; H01L 31/00
[52] U.S. Cl. .................................. 257/232; 257/221; 257/222; 257/233; 257/236; 257/246; 257/249
[58] Field of Search ............... 257/221, 222, 232, 233, 257/236, 246, 249

[56] References Cited

U.S. PATENT DOCUMENTS

| | | | |
|---|---|---|---|
| 4,652,928 | 3/1987 | Endo | 358/213 |
| 4,680,636 | 7/1987 | Ooi | 358/213.18 |
| 4,680,637 | 7/1987 | Sugiki | 358/213.26 |
| 5,063,449 | 11/1991 | Shibata | 358/213.11 |
| 5,111,263 | 5/1992 | Stevens | 357/24 |

Primary Examiner—Ngan Ngo
Attorney, Agent, or Firm—Faegre & Benson

[57] ABSTRACT

A CCD image sensor of an interlaced scanning type comprising a plurality of uniformly spaced photodetectors arranged in series in vertical and horizontal directions, a plurality of VCCD regions arranged between sets of said photodetectors arranged in the vertical directions, a plurality of channel stop regions for electrically isolating said plurality of photodetectors from one another, a plurality of gate electrodes formed on said VCCD regions, each of said plurality of gate electrodes being connected simultaneously to transfer gate electrodes of adjacent ones of said plurality of photodetectors on odd and even horizontal lines, a plurality of barrier layers, each formed at a portion of each of said VCCD regions corresponding to a boundary with each of said gate electrodes on said VCCD regions, for forming a desired potential barrier, and a HCCD region formed under said plurality of VCCD regions, for transferring signal charges from said VCCD regions to an output stage. Therefore, in accordance with the present invention, the gate electrodes can be reduced from four of the prior art to two in number, resulting in simplification in construction and manufacturing process thereof. Also, the reduction in number of the gate electrodes to two allows the driving system to be simple.

5 Claims, 6 Drawing Sheets

Fig. 3B
PRIOR ART
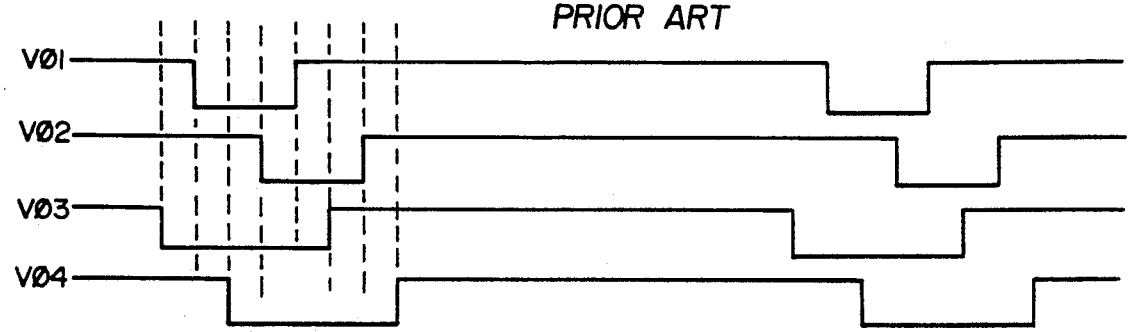
Fig. 3C
PRIOR ART
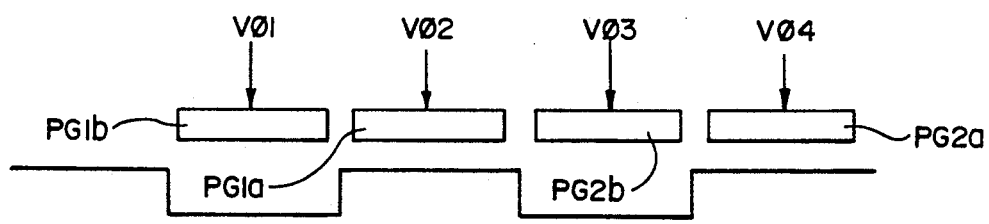
Fig. 3D
PRIOR ART
| 1 | 1 | 1 | 1 | 1 | 1 |
|---|---|---|---|---|---|
| 2 | 2 | 2 | 2 | 2 | 2 |
| 1 | 1 | 1 | 1 | 1 | 1 |
| 2 | 2 | 2 | 2 | 2 | 2 |
| 1 | 1 | 1 | 1 | 1 | 1 |
| 2 | 2 | 2 | 2 | 2 | 2 |
| 1 | 1 | 1 | 1 | 1 | 1 |

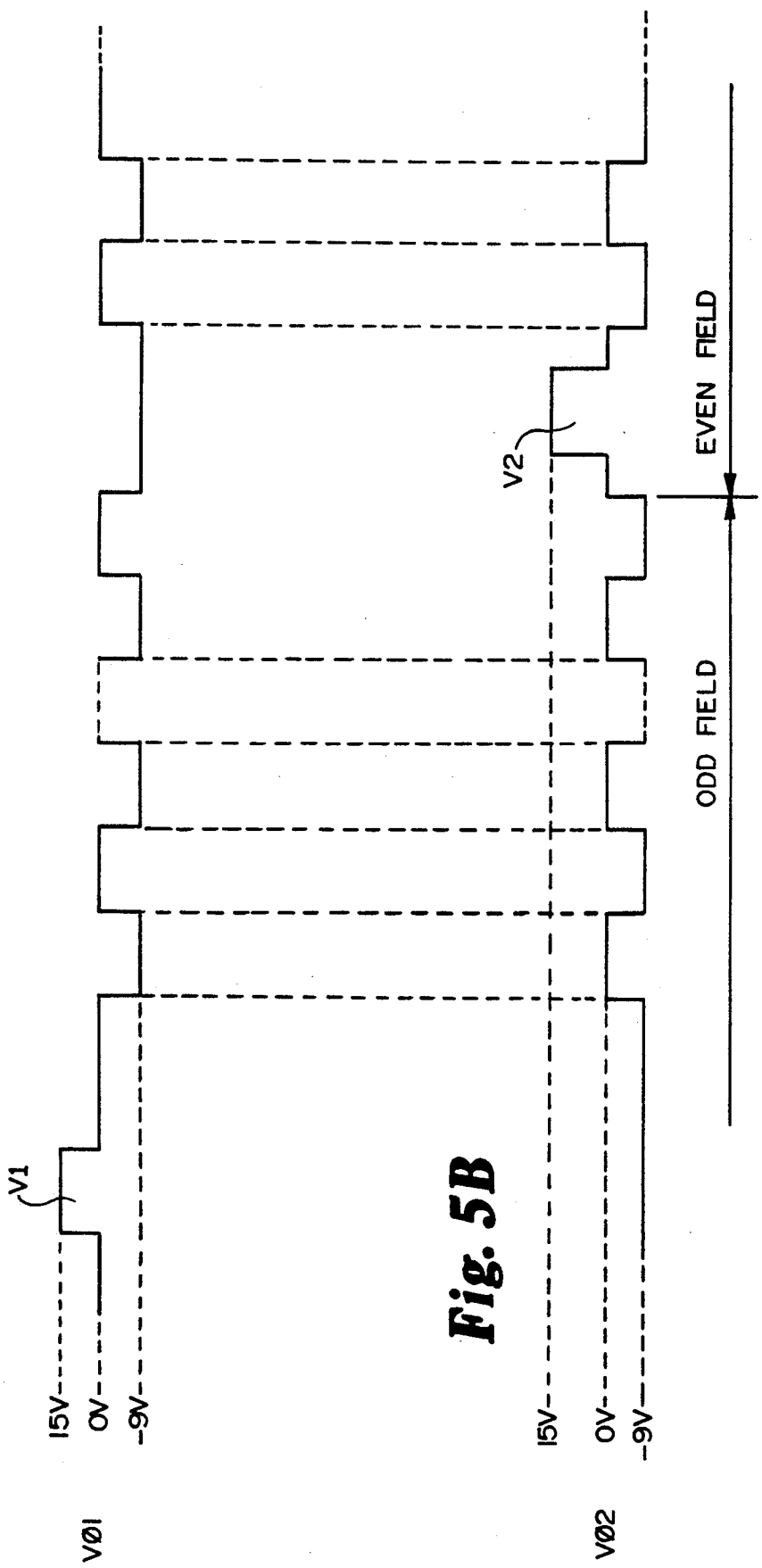

CCD IMAGE SENSOR OF INTERLACED SCANNING TYPE

CROSS-REFERENCE TO RELATED APPLICATION

This application is a continuation of my co-pending U.S. Ser. No. 07/834,113, filed Feb. 11, 1992, entitled CCD IMAGE SENSOR OF INTERLACED SCANNING TYPE, now abandoned.

BACKGROUND OF THE INVENTION

1. Field of the Invention

The present invention relates in general to a CCD image sensor, and more particularly to a CCD image sensor of interlaced scanning type.

2. Description of the Prior Art

Generally, a CCD is believed to be an active device for transferring, under a control of a clock pulse a signal charge corresponding to incident light incoming along a predetermined path and has typically been used in image processing devices, such as, for example, a storage device, a logic element, a CCD image sensor, etc.

The scanning of the CCD image sensor employing the CCD is typically of either an interlaced scanning type or a non-interlaced scanning type.

In non-interlaced scanning, there is provided one picture, i.e., one frame containing a plurality of fields, with the scanning on the screen beginning with data in the first input field, as shown in FIG. 1A.

In FIG. 1A, the display of each of fields on the screen in their input orders are designated as the numerals 1, 2, 3. On the other hand, in interlaced scanning, there is provided one frame containing a plurality of even fields and a plurality of odd fields, with the scanning on the screen beginning with data in the odd field, as shown in FIG. 1B.

In FIG. 1B, the numeral 1 designates each of the odd fields and the numeral 2 designates each of the even fields.

Therefore, in non-interlaced scanning, the scanning rate is fast, so such that the actual image of a fast moving object can be picked up accurately. For this reason, the noninterlaced scanning may be applied to a military equipment, such as missile tracking equipment.

However, a problem with this non-interlaced scanning is that the image shakes on the screen.

For interlaced scanning, there is provided a sense of stability of the image in that the scanning rate is slower than that in non-interlaced scanning, but a fast moving object appears as two images. For this reason, interlaced scanning is inappropriate for military purposes and typically is applied to a television broadcasting system, such as a NTSC system or a PAL system, for the scanning of an image on the screen.

Construction of a conventional CCD image sensor of the interlaced scanning type is discussed with reference to FIGS. 2A through 2D below.

With reference to FIG. 2A, there is shown a schematic diagram of the construction of a conventional CCD image sensor of the interlaced scanning type. A conventional CCD image sensor comprises an N type horizontal charge coupled device (HCCD) region and a plurality of N type vertical charge coupled device (VCCD) regions, to each of which a series of N type photodiodes PD are connected. Each of the N type photodiodes PD is connected to an N type VCCD region such that an image signal charge output therefrom is transferred to the N type VCCD region in a single direction. Also, the N type VCCD regions are connected to the N type HCCD region, such that the signal charges transferred from the photodiodes PD are transferred to the N type HCCD region simultaneously in response to first to fourth VCCD clock signals $V\phi1$-$V\phi4$, one clock signal corresponding to one phase.

With reference to FIG. 2B, there is shown a layout diagram of the construction of the conventional CCD image sensor in FIG. 2A. The CCD image sensor comprises a channel stop region ST, formed between each of the N type VCCD regions and each of the N type photodiodes PD. An odd gate electrode PG1 is formed over each of the N type VCCD regions and each of the channel stop regions ST such that it is connected to each of transfer gates TG1 of the N type photodiodes PD arranged on an odd horizontal line, the odd gate electrode PG1 being supplied with the first and the second clock signals $V\phi1$-$V\phi2$. On the other hand, an even gate electrode PG2 is formed over each of the channel stop regions ST, each of the N type VCCD regions and each of the N type photodiodes PD, such that it is connected to each of transfer gates TG2 of the N type photodiodes PD arranged on an even horizontal line, the even gate electrode PG2 being supplied with the third and the fourth clock signals $V\phi3$-$V\phi4$.

Forming of the odd gate electrode PG1 and the even gate electrode PG2 may be repeated successively, as required by a layout of the CCD image sensor, in the same form. Also, these electrodes PG1 and PG2 are generally electrically isolated from each other by a region (not shown) of an insulating material, such as silicon oxide.

On the other hand, materials of the transfer gates TG1 and TG2 and the odd and even gate electrodes PG1 and PG2 may be polysilicon.

The odd gate electrode PG1 includes a first odd gate electrode PG1a formed under each of the N type photodiodes PD on the odd horizontal line and a second odd gate electrode PG1b formed over each of the N type photodiodes PD on the odd horizontal line and connected to each of the transfer gates TG1 of the photodiodes PD on the odd horizontal line, the first odd gate electrode PG1a being supplied with the second VCCD clock signal $V\phi2$ and the second odd gate electrode PG1b being supplied with the first VCCD clock signal $V\phi1$.

The even gate electrode PG2 includes a first even gate electrode PG2a formed under each of the N type photodiodes PD on the even horizontal line and a second even gate electrode PG2b formed over each of the N type photodiodes PD on the even horizontal line and connected to each of the transfer gates TG2 of the photodiodes PD on the even horizontal line, the first even gate electrode PG2a being supplied with the fourth VCCD clock signal $V\phi4$ and the second even gate electrode PG2b being supplied with the third VCCD clock signal $V\phi3$.

Also, the first through the fourth VCCD clock signals $V\phi1$-$V\phi4$ of four phases corresponds to two fields, i.e. an even field and an odd field. The clocking operation of the N type VCCD region will be described hereinafter in more detail.

With reference to FIG. 2C, there is shown a sectional view, taken on the line a—a' of FIG. 2B. A conventional CCD image sensor comprises an N type substrate 100 and a P type well 200, formed on the N type substrate 100. Also on the N type substrate 100 are configured a series of arrangements that the N type photodiode PD and the N type VCCD region on the even horizontal line are connected to each other at a desired interval via the channel stop region ST. Each of the transfer gates TG2 is formed over and between each of the N type photodiodes PD and each of the N type VCCD regions to connect them with each other. Also over the surface of each of the N type VCCD regions is formed a second even gate electrode PG2b being supplied with the third VCCD clock signal $V\phi3$, to be connected to each of the transfer gates TG2 of the N type photodiodes PD arranged on the even horizontal line.

Herein, the p type well 200 is comprised of two types, a shallow P type well 200a and a deep P type well 200b, for control of over flow drain (OFD) voltage.

On the surface of each of the N type photodiodes PD is generally formed a $P^+$ type thin layer 300 for application of an initial bias. In FIG. 2C, the lower side of the channel stop region ST designated as the character $P^+$, indicates a channel stop ion region.

Referring to FIG. 2D, there is shown a sectional view, taken on the line b—b' of FIG. 2B. The P type well 200 is formed on the N type substrate 100, identically to FIG. 2C. Also on the N type substrate 100 are configured a series of N type photodiode PD regions and N type VCCD regions on an even horizontal line connected to each other at desired intervals via channel stop region ST. Also, over the surface of each of the N type VCCD regions is formed a first even gate electrode PG2a supplied with the fourth VCCD clock signal $V\phi4$.

Similarly, on the surface of each of the N type photodiodes PD is generally formed a $P^+$ type thin layer 300 for application of an initial bias. In FIG. 2D, the lower side of the channel stop region ST, designated by the character $P^+$, indicates a channel stop ion region. Herein, the P type well 200 is comprised of a shallow P type well 200a and a deep P type well 200b, for the control of over flow drain (OFD) voltage.

Hence, the transfer gate TG1 of each of the N type photodiodes PD, arranged on an odd horizontal line, is driven only by the first VCCD clock signal $V\phi1$ applied to the second odd gate electrode PG1b, and the transfer gate TG2 of each of the N type photodiodes PD, arranged on an even horizontal line, is driven only by the third VCCD clock signal $V\phi3$ applied to the second even gate electrode PG2b.

The second VCCD clock signal $V\phi2$, applied to the first odd gate electrode PG1a and the fourth VCCD clock signal $V\phi4$, applied to the first even gate electrode PG2a, serve merely to transfer image signal charges traveling from the N type photodiodes PD arranged on the odd and even horizontal lines toward the HCCD region.

Now, the operation of a conventional CCD image sensor of the above-mentioned construction will be described with reference to FIGS. 3A through 3D.

With reference to FIG. 3A, there is shown a timing diagram of the first through fourth VCCD clock signals $V\phi1-V\phi4$ of four phases, each including two fields, an even field and an odd field.

In FIG. 3A, in the odd field of the first VCCD clock signal $V\phi1$ of tri-state levels, applied to the second odd gate electrode PG1b is contained a transfer gate drive voltage VI of high level (15V). Also, in the even field of the third VCCD clock signal $V\phi3$ applied to the second even gate electrode PG2b is contained a transfer gate drive voltage V2 of high level (15V).

If the first through fourth VCCD clock signals $V\phi1-V\phi4$ in the odd field are supplied simultaneously, the transfer gates TG1 of the N type photodiodes PD arranged on each of the odd horizontal lines are turned on simultaneously by the transfer gate drive voltage VI contained in the first VCCD clock signal $V\phi1$.

For this reason, the image signal charges produced from the N type photodiodes PD are transferred to the N type VCCD regions, to potential pockets formed under the second odd gate electrodes PG2b as shown in FIG. 3C. and then toward the N type HCCD region by the VCCD clocking operation.

FIG. 3B is a pulse waveform diagram of the first through fourth clock signals $V\phi1-V\phi4$ at the unit interval K of FIG. 3A. The image signal charges produced from the N type photodiodes PD are transferred vertically toward the N type HCCD region by a series of clocking operations, as shown in FIG. 3B.

At this time, the second VCCD clock signal $V\phi2$, supplied through the first odd gate electrode PG1a formed in the lower side of the odd horizontal line, serves merely to transfer the image signal charges transferred from the N type photodiodes PD arranged on the even horizontal line by the first VCCD clock signal $V\phi1$ to the N type HCCD region, together with the first VCCD clock signal $V\phi1$.

Thereafter, if the first through the fourth VCCD clock signals $V\phi1-V\phi4$ in the even field in FIG. 3A are supplied simultaneously, the transfer gates TG2 of the N type photodiodes PD arranged on each of the even horizontal lines are turned on simultaneously by the transfer gate drive voltage V2 contained in the third VCCD clock signal $V\phi3$.

As a result, the image signal charges produced from the N type photodiodes PD on the even horizontal line are transferred to the N type VCCD regions and then toward the N type HCCD region by the VCCD clocking operation, as shown in FIG. 3B, in the same manner as that of the odd field. At this time, the signal charges transferred from the photodiodes PD on the even horizontal lines are gathered with the signal charges transferred from the photodiodes PD on the odd horizontal lines in potential pockets formed under the second even gate electrodes PG2b, as shown in FIG. 3C, by the odd gate electrodes PG1, and then the gathered signal charges are transferred toward the HCCD region.

At this time, the fourth VCCD clock signal $V\phi4$, supplied through the first even gate electrode PG2a of the even gate electrode PG2 formed in the lower side of the even horizontal line, serves merely to transfer the image signal charges transferred from the N type photodiodes PD arranged on the even horizontal line by the third VCCD clock signal $V\phi3$ to the N type HCCD region, together with the third VCCD clock signal $V\phi3$.

As stated, the use of VCCD clock signals of four phases has the effect of transferring more of the image signal charge than would use of VCCD clock signals of two phases.

As a result, as mentioned above, application of VCCD clocking signals of four phases, i.e. the first through fourth VCCD clock signals $V\phi1-V\phi4$ as shown in FIG. 3A, the image signal charges from the N type photodiodes PD arranged in the odd horizontal line are scanned first in sequence on the screen through the N type VCCD regions and then through the N type HCCD region and then the image signal charges from the N type photodiodes PD, arranged in the even horizontal line are scanned in sequence on the screen through the N type VCCD regions and then through the N type HCCD region.

As previously stated, the scanning of the CCD image sensor as mentioned above is usually referred to as an interlaced scanning type.

With reference to FIG. 3D, there is shown a pixel format of one picture, or one frame, the picture being comprised of pixels, each being displayed as the numerals 1 and 2, each designating the image signal charges from the N type photodiodes PD arranged in odd and even horizontal lines as shown in FIG. 2A, respectively.

In result, as mentioned above, a conventional CCD image sensor of the interlaced scanning type has an advantage, in that the image signal charges can be transferred at high speed by the four phase clocking operation.

However, a conventional CCD image sensor of the interlaced scanning type also has disadvantages as follows:

First, the photodiodes PD arranged on the odd and even horizontal lines comprise respective typical color filters formed thereon to output different chrominance signals. For this reason, in a case where the different chrominance signals outputted from the photodiodes PD arranged on the odd and even horizontal lines are collected to produce a new chrominance signal and the new chrominance signal is then transferred toward the HCCD region, an additional apparatus is required for mixing the chrominance signals outputted from the photodiodes PD arranged on the odd and even horizontal lines.

Second, the VCCD region driving clock signals are as many as four in number, resulting in complexity of the driving system. Also, four gate electrodes are required to apply the four clock signals, corresponding to the number of the clock signals, thereby resulting in complexity in construction of the conventional CCD image sensor of the interlaced scanning type.

SUMMARY OF THE INVENTION

The present invention has been made in view of the above problems, and it is an object of the present invention to provide a CCD image sensor of interlaced scanning type which has a simplified driving system and construction and is capable of readily mixing chrominance signals output from photodiodes arranged on odd and even horizontal lines.

In accordance with the present invention, this object can be accomplished by providing a CCD image sensor of an interlaced scanning type, comprising:

a plurality of uniformly spaced photodetectors arranged in series in vertical and horizontal lines;

a plurality of VCCD regions arranged between sets of said photodetectors arranged in the vertical direction;

a plurality of channel stop regions for electrically isolating said plurality of photodetectors from one another;

a plurality of transfer gate electrodes formed on said VCCD regions, each of said plurality of transfer gate electrodes being connected simultaneously to transfer gate electrodes of adjacent ones of said plurality of photodetectors on odd and even horizontal lines;

a plurality of barrier layers, each forming at least a portion of each of said VCCD regions to define a boundary for each of said transfer gate electrodes associated with said VCCD regions, for forming a desired potential barrier; and an HCCD region formed under said plurality of VCCD regions, for transferring signal charges from said VCCD regions to an output stage.

BRIEF DESCRIPTION OF THE DRAWINGS

The above and other objects, features and advantages of the present invention will be more clearly understood from the following detailed description taken in conjunction with the accompanying drawings, in which:

FIG. 3B is a pulse waveform diagram of the VCCD clock signals at the unit interval K of FIG. 3A;

FIG. 3C is a view illustrating a transfer of image signal charges according to the layout of the conventional CCD image sensor of FIG. 2B;

FIG. 3D is a pixel format of one picture, or one frame in a conventional CCD image sensor of the interlaced scanning type;

FIG. 5A is a timing diagram of a first VCCD clock signal according to the present invention; and FIG. 5B is a timing diagram of a second VCCD clock signal according to the present invention.

DETAILED DESCRIPTION OF PREFERRED EMBODIMENTS

First, a construction of a CCD image sensor of interlaced scanning type in accordance with the present invention will be described with reference to FIGS. 4A through 4D. Some aspects of the construction of a CCD image sensor of the interlaced scanning type in accordance with the present invention are substantially identical to that in FIG. 2A according to the prior art. Hence, a detailed description of those portions is omitted.

Figure 4A:
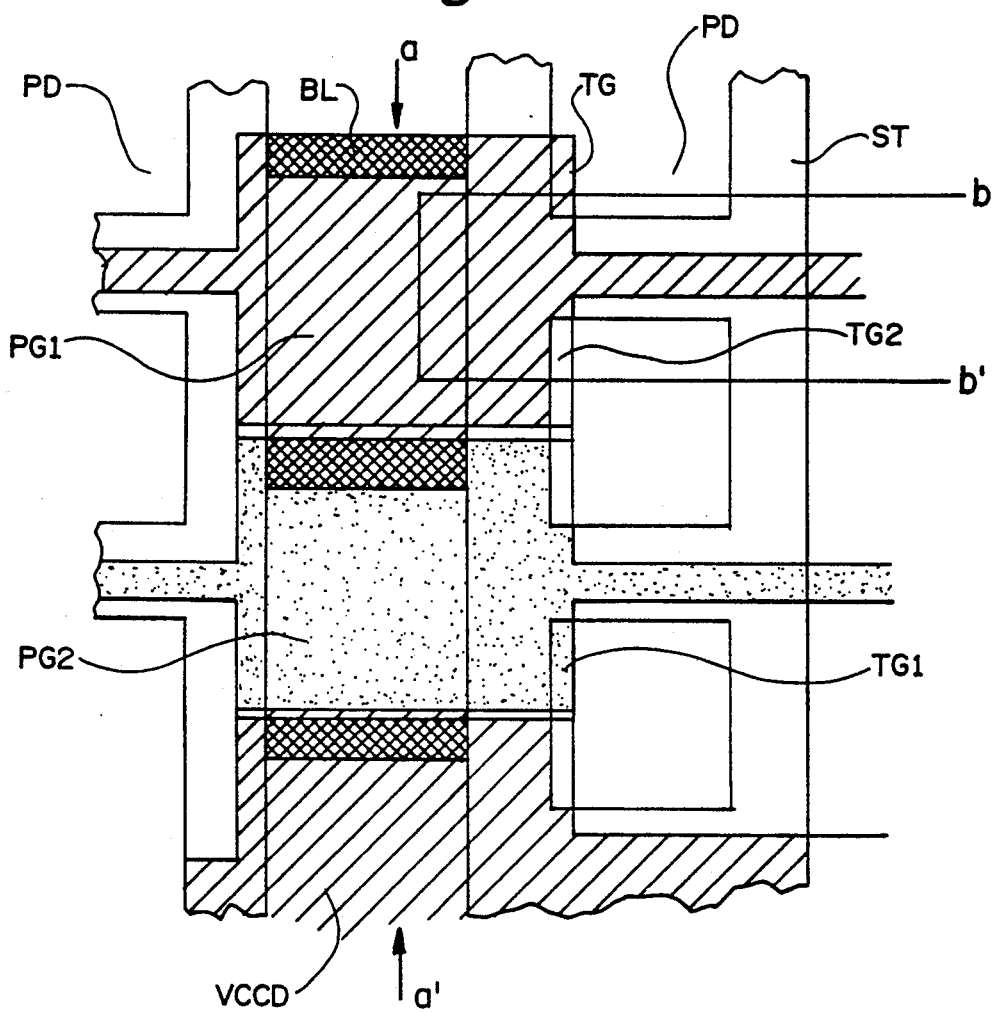
FIG. 4A is a layout diagram of a construction of a CCD image sensor of the interlaced scanning type in accordance with the present invention.

With reference to FIG. 4A, there is shown a layout diagram of a construction of the CCD image sensor of the interlaced scanning type in accordance with the present invention. As shown in FIG. 4A, a CCD image sensor of the interlaced scanning type in accordance with the present invention comprises a plurality of uniformly spaced N type photodiodes PD arranged in series in vertical and horizontal directions, for producing signal charges corresponding to incident light incoming along a predetermined path. Each of the N type photodiodes PD are connected one to one to each of a plurality of VCCD regions. Each of gate electrodes PG1 and PG2 is connected simultaneously to transfer gate electrodes TG1 and TG2 of each of the photodiodes PD on odd and even horizontal lines. Also, the N type VCCD regions are connected to a N type HCCD region, such that the signal charges transferred from the photodiodes PD are transferred simultaneously to the N type HCCD region, which then transfers the signal charges from the VCCD regions to an output stage. On the other hand, a potential pocket forming barrier layer BL is formed at a portion of each of the VCCD regions corresponding to a boundary with each of the gate electrodes PG1 and PG2.

Also, the CCD image sensor of the interlaced scanning type in accordance with the present invention comprises channel stop regions ST for electrically isolating the photodiodes PD from one another.

Each of gate electrodes PG1 and PG2 is formed over the channel stop region ST, the transfer gate electrodes TG1 and TG2 of the photodiode PD and the VCCD region. The gate electrodes PG1 and PG2 and the transfer gate electrodes TG1 and TG2 are formed polysilicon in the preferred embodiment shown.

Figure 4B:
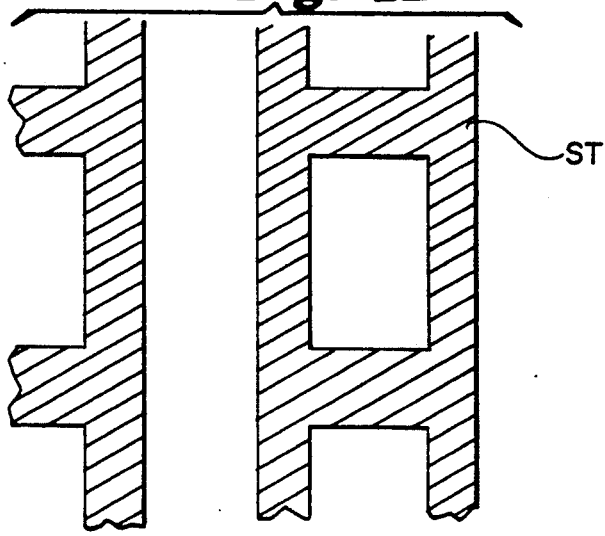
FIG. 4B is a view illustrating an arrangement of a channel stop region in FIG. 4A.

FIG. 4B is a view illustrating an arrangement of the channel stop region ST in FIG. 4A.

Figure 4C:
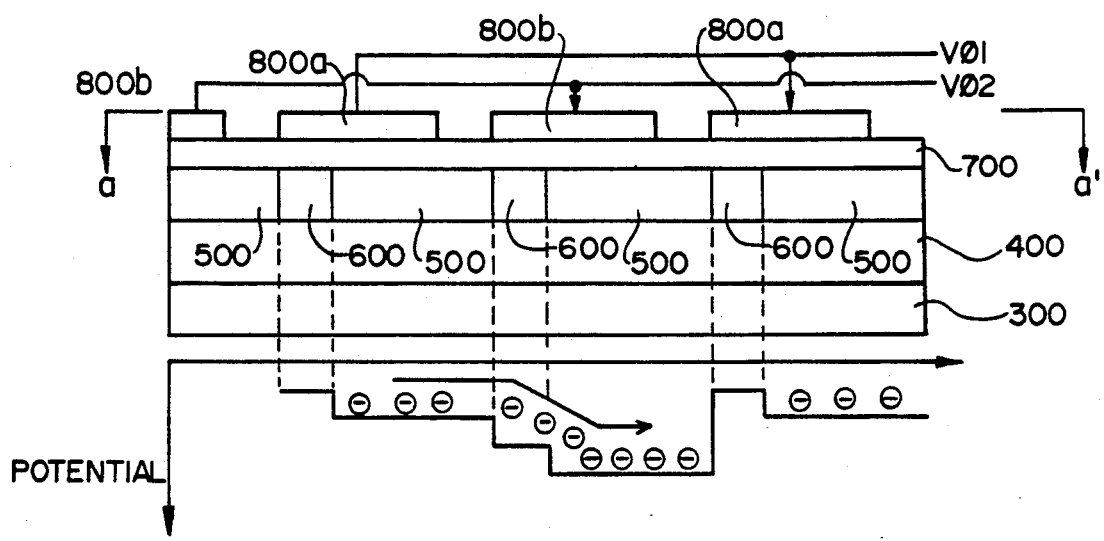
FIG. 4C is a sectional view, in addition to the illustration of potential profiles, taken on the line a—a' of FIG. 4A.

With reference to FIG. 4C, there is shown a sectional view, in addition to the illustration of potential profiles, taken on the line a—a' of FIG. 4A. As shown in FIG. 4C, an N type substrate 300 is formed a P type well 400, on which are in turn formed the N type VCCD region 500 and the N type barrier layer 600. A gate insulating layer 700 is formed on the N type VCCD region 500 and N type barrier layer 600. On the gate insulating layer 700 are repeatedly formed a pair of uniformly spaced odd gate electrodes 800a and even gate electrodes 800b, each of which corresponds one to one to the N type barrier layer 600 and the N type VCCD region 500.

The odd gate electrode 800a is supplied with a first VCCD clock signal Vφ1 and the even gate electrode 800b is supplied with a second VCCD clock signal Vφ2. As a result, when the first VCCD clock signal Vφ2 is low while the second VCCD clock signal Vφ2 is high, a deep potential pocket is formed in the N type VCCD region 500 under the even gate electrode 800b, as shown in FIG. 4C. In result, the signal charges from the N type photodiodes PD are gathered in the deep potential pocket in the VCCD region 500 under the even gate electrode 800b.

On the other hand, the N type barrier layer 600 has a doping concentration lower than that of the N type VCCD region 500 for forming of a high potential barrier. Alternatively, a P type barrier layer may be employed which has a concentration higher than that of the N type VCCD region 500 for forming of a high potential barrier.

Figure 4D:
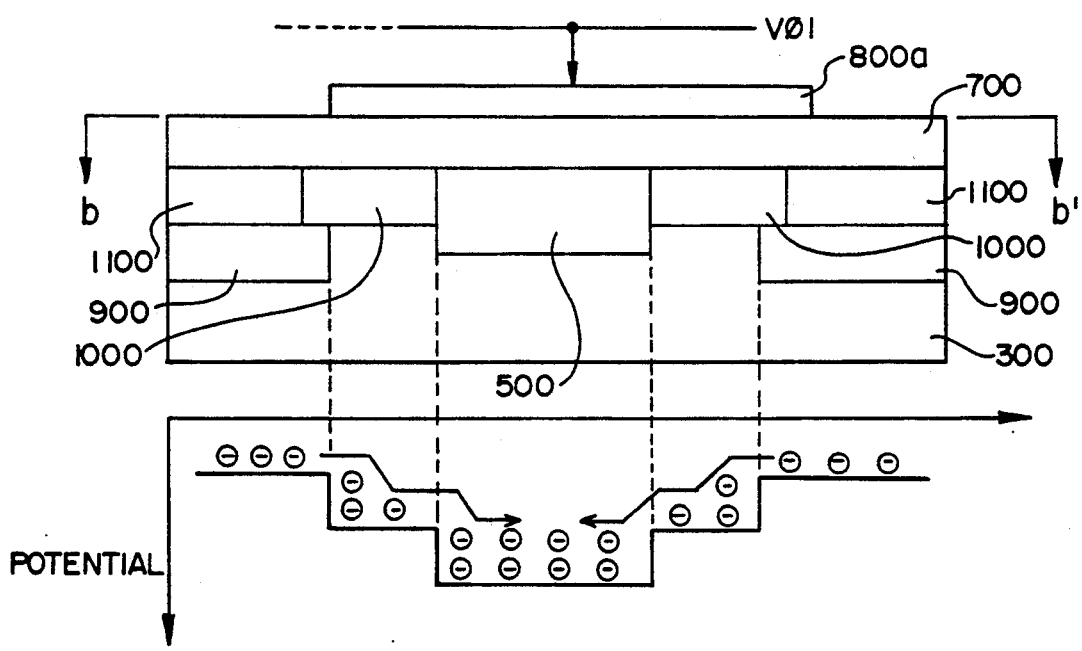
FIG. 4D is a sectional view, taken on the line b—b' of FIG. 4A, which also includes a plot of the potential profiles across the sensor.

With reference to FIG. 4D, there is shown a sectional view, in addition to the illustration of potential profiles, taken on the line b—b' of FIG. 4A. As shown in FIG. 4D, on the N type substrate 300 is formed the P type well 400, on which are formed a plurality of uniformly spaced N type photodiodes 900. The N type VCCD region 500 is formed between the N type photodiodes 900 such that it is connected to the N type photodiodes 900 through P+ type channel stop regions 1000.

On the N type photodiode 900 is formed a P+ type thin layer 1100 for application of an initial bias. The gate insulating layer 700 is formed over the P+ type channel stop region 1000, the N type VCCD region 500 and the P+ type thin layer 1100. Also, the odd gate electrode 800a is formed on portions of the gate insulating layer 700 above the P+ type channel stop region 1000 and the N type VCCD region 500.

As a result, if the first VCCD clock signal Vφ1 is high while the second VCCD clock signal Vφ2 is low, i.e., if a transfer gate drive voltage of high level is applied to the odd gate electrode 800a, a deep potential pocket is formed in the N type VCCD region 500 under the odd gate electrode 800a, as shown in FIG. 4D. In result, the signal charges from both of the N type photodiodes 900 are transferred to the deep potential pocket in the VCCD region 500 under the odd gate electrode 800a.

Now, the operation of a CCD image sensor of the interlaced scanning type with the above-mentioned construction in accordance with the present invention will be described in detail with reference to FIGS. 5A and 5B.

With reference to FIGS. 5A and 5B, there are shown respectively timing diagrams of the first and second VCCD clock signals Vφ1 and Vφ2 of tri-state levels according to the present invention. First, in the odd field of FIGS. 5A and 5B, if the first and second VCCD clock signals Vφ1 and Vφ2 are supplied respectively to the odd and even gate electrodes 800a and 800b simultaneously, the signal charges produced from the two N type photodiodes 900 on one odd horizontal line and one even horizontal line under the odd gate electrode 800a are transferred to the N type VCCD region 500 under the odd gate electrode 800a by a transfer gate electrode TG1 and TG2 drive voltage VI contained in the first VCCD clock signal Vφ1.

That is, upon application of the transfer gate electrode TG1 and TG2 drive voltage VI to the odd gate electrode 800a, the transfer gate electrodes TG1 and TG2 are turned on and then a deep potential pocket is formed in the N type VCCD region 500 under the odd gate electrode 800a, as shown in FIG. 4D. In result, the signal charges from both of the N type photodiodes 900 on one odd horizontal line and one even horizontal line, the transfer gate electrodes TG1 and TG2 of which are connected to the odd gate electrode 800a, are transferred simultaneously to the deep potential pocket in the VCCD region 500 under the odd gate electrode 800a.

As mentioned above, the signal charges gathered in the deep potential pocket in the VCCD region 500 under the odd gate electrode 800a cannot be mixed with the signal charges transferred by the different gate electrodes, i.e., the different odd gate electrodes 800a and the even gate electrodes 800b, since the barrier layer 600 is formed at a portion of each of the VCCD regions corresponding to a boundary with each of the gate electrodes PG. The signal charges gathered in the deep potential pocket in the VCCD region 500, under the odd gate electrode 800a, are transferred to the HCCD region shown in FIG. 2A by the first and second VCCD clock signals Vφ1 and Vφ2 until completion of the odd field.

The process in which the signal charges transferred from the N type photodiodes 900 to the N type VCCD regions 500 are transferred to the HCCD region is otherwise the same as that in the prior art. Hence, a description of the process may be omitted.

Then, in the even field of FIGS. 5A and 5B, if a transfer gate electrode TG1 and TG2 drive voltage V2 contained in the second VCCD clock signal Vφ2 is supplied simultaneously to the transfer gate electrodes TG1 and TG2 through the even gate electrode 800b, the signal charges produced from the two N type photodiodes 900 on one odd horizontal line and one even horizontal line under the even gate electrode 800b are transferred to the N type VCCD region 500 under the even gate electrode 800b.

That is, upon application of the transfer gate electrode TG1 and TG2 drive voltage V2 to the even gate electrode 800b, the transfer gate electrodes TG1 and TG2 are turned on and then a deep potential pocket is formed in the N type VCCD region 500 under the even gate electrode 800b, as shown in FIG. 4C. In result, the signal charges from both of the N type photodiodes 900 on one odd horizontal line and one even horizontal line, the transfer gate electrodes TG1 and TG2 of which are connected to the even gate electrode 800b, are transferred simultaneously to the deep potential pocket in the VCCD region 500 under the even gate electrode 800b.

Figure 1A:
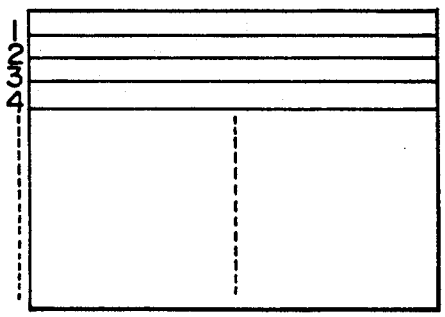
FIG. 1A is a view illustrating non-interlaced scanning of a CCD image sensor.
Figure 1B:
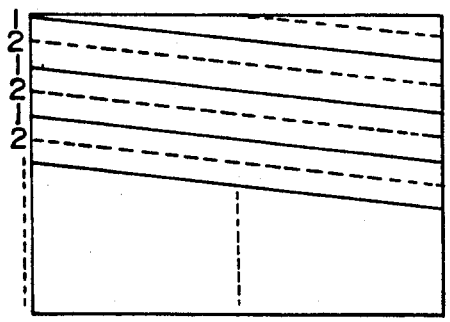
FIG. 1B is a view illustrating interlaced scanning of CCD image sensor.
Figure 2A:
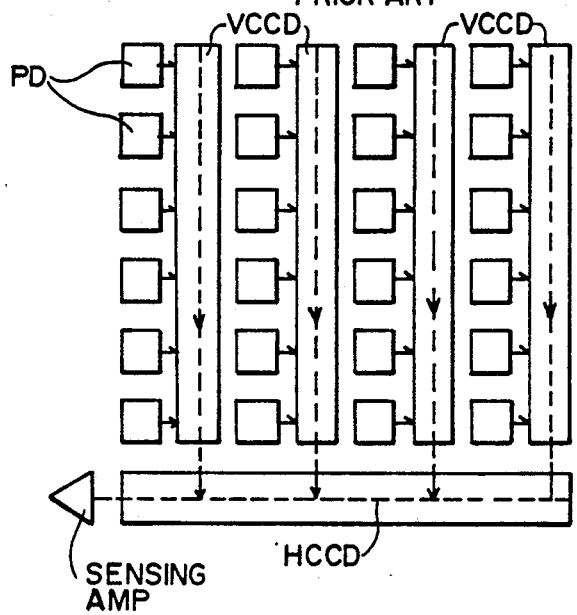
FIG. 2A is a schematic diagram of a construction of a conventional CCD image sensor of the interlaced scanning type.
Figure 2B:
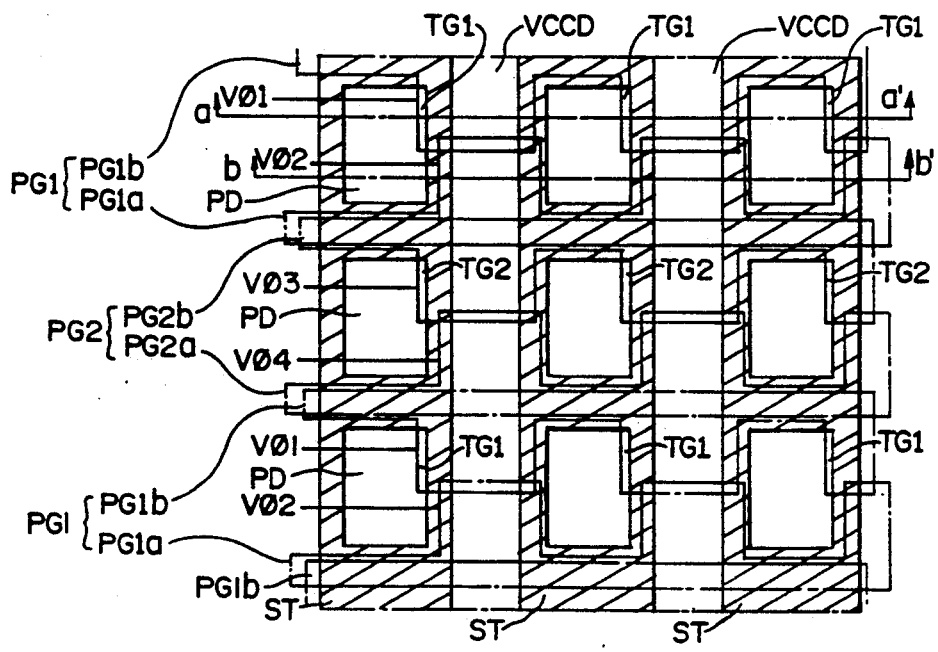
FIG. 2B is a layout diagram of the construction of the conventional CCD image sensor in FIG. 2A.
Figure 2C:
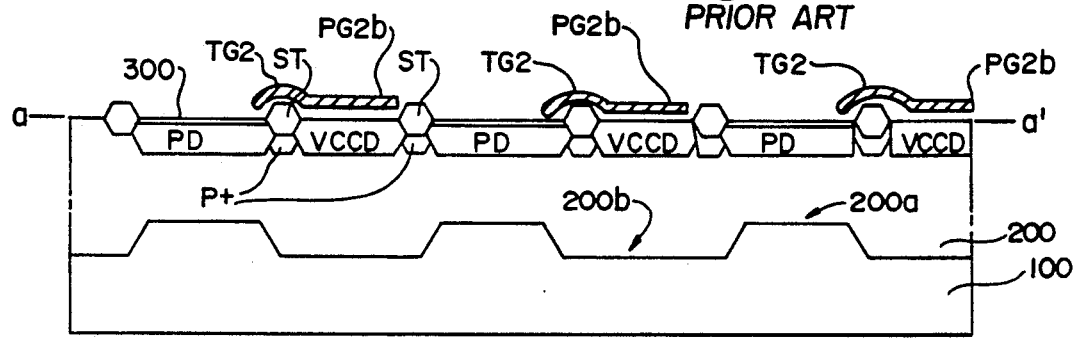
FIG. 2C is a sectional view, taken on the line a—a' of FIG. 2B.
Figure 2D:
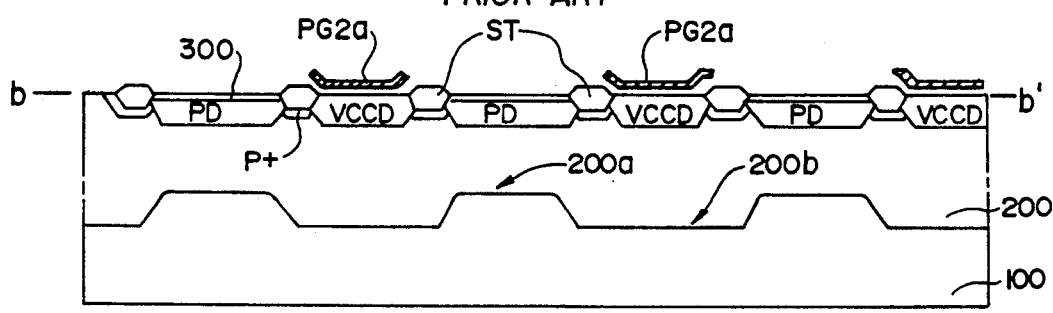
FIG. 2D is a sectional view, taken on the line b—b' of FIG. 2B.
Figure 3A:
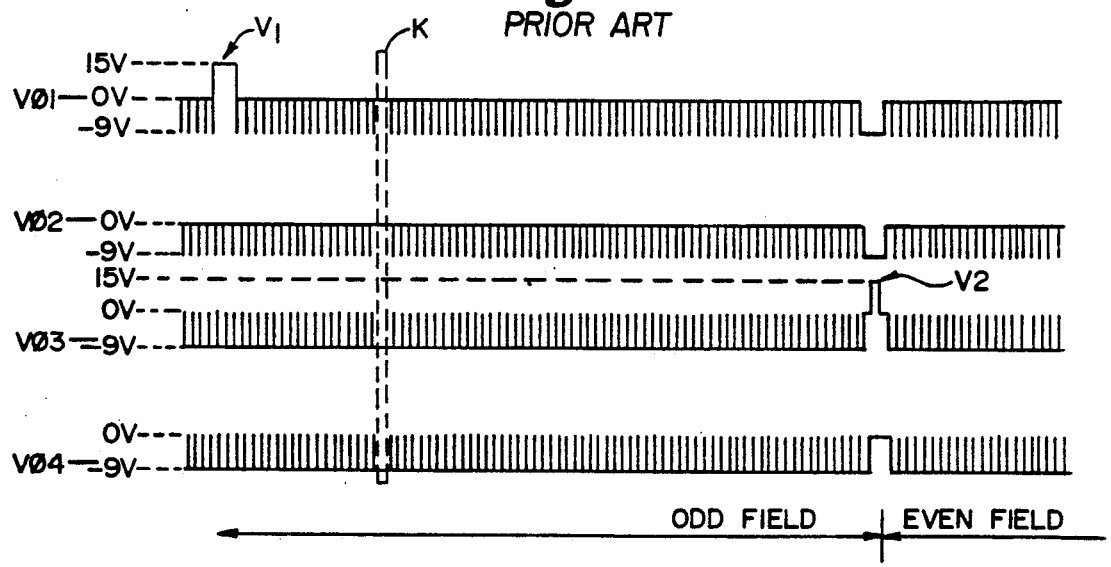
FIG. 3A is a timing diagram of VCCD clock signals in a conventional CCD image sensor of the interlaced scanning type.

The signal charges gathered in the deep potential pocket in the VCCD region 500 under the even gate electrode 800b are transferred to the HCCD region shown in FIG. 2A by the first and second VCCD clock signals Vφ1 and Vφ2 until completion of the even field, in the same manner as that of the odd gate electrode 800a. At this time, the signal charges gathered in the deep potential pocket in the VCCD region 500 under the even gate electrode 800b cannot be mixed with the signal charges transferred by the different gate electrodes, i.e., the different even gate electrodes 800b and the odd gate electrodes 800a, because of the potential barrier of the barrier layer 600.

Therefore, an occurrence of noise and a degradation of picture on the screen can be prevented.

As hereinbefore described, in accordance with the present invention, the improved CCD image sensor of the interlaced scanning type can provide advantages as follows:

First, the gate electrodes can be reduced from four of the prior art to two in number, resulting in simplification in construction and manufacturing process thereof.

Second, the reduction in number of the gate electrodes to two allows the driving system to be simple.

Third, in a case where the photodiodes arranged on the odd and even horizontal lines comprise respective typical color filters formed thereon, different chrominance signals outputted from the photodiodes on the odd and even horizontal lines are collected and combined to produce a new chrominance signal and the new chrominance signal is then transferred toward the HCCD region, without an additional apparatus for mixing the chrominance signals outputted from the photodiodes.

Although the preferred embodiments of the present invention have been disclosed for illustrative purpose, those skilled in the art will appreciate that various modifications, additions and substitutions are possible, without departing from the scope and spirit of the invention as disclosed in the accompanying claims.

What is claimed is:

1. A CCD image sensor of an interlaced scanning type, comprising:
   a plurality of uniformly spaced photodetectors which accumulate signal charges in response to incident light, the photodetectors being arranged in series in vertical and alternating odd and even horizontal lines, each photodetector having a transfer gate electrode which causes the output of the accumulated signal charge of the photodetector upon the application of a transfer gate drive voltage to the transfer gate electrode;
   a plurality of VCCD regions arranged between the vertical lines of the photodetectors;
   a plurality of channel stop regions for electrically isolating said plurality of photodetectors from one another;
   a plurality of gate electrodes formed on said VCCD regions, each of said plurality of gate electrodes being connected simultaneously to the transfer gate electrodes of a plurality of photodetector pairs, each photodetector pairs having a first photodetector located in a common vertical line and a particular odd horizontal line, and a second photodetector located in the common vertical line and an even horizontal line adjacent to the particular odd horizontal line;
   a plurality of barrier layers, each forming at least a portion of each of said VCCD regions to define separate subregions in the VCCD regions by forming a desired potential barrier, such that applying a transfer gate drive voltage to the transfer gate electrodes of the photodetector pairs via the gate electrodes causes the first photodetector and the second photodetector in each photodetector pair to output their charge signals into the same subregion of the adjacent VCCD region, thereby causing the signal charges of the first and second photodetectors to be added into a combined signal charge; and
   an HCCD region formed under said plurality of VCCD regions, for transferring the combined signal charges of the photodetector pairs from said VCCD regions to an output stage.

2. A CCD image sensor of an interlaced scanning type, as set forth in claim 1, wherein said barrier layers are of the same conductive type as those of said VCCD regions and have a doping concentration lower than those of said VCCD regions.

3. A CCD image sensor of an interlaced scanning type, as set forth in claim 1, wherein said barrier layers are of a conductive type different from those of said VCCD regions and have a doping concentration higher than those of said VCCD regions.

4. A CCD image sensor of an interlaced scanning type, as set forth in claim 1, wherein said photodetectors and said VCCD regions are of the same conductive type with respect to each other and are of a conductive type different from those of said channel stop regions.

5. A CCD image sensor of an interlaced scanning type, as set forth in claim 1, wherein said gate electrodes on said VCCD regions are of polysilicon.

* * * * *